US011075603B1

(12) United States Patent
Lin

(10) Patent No.: US 11,075,603 B1
(45) Date of Patent: Jul. 27, 2021

(54) INTEGRATED LC OSCILLATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/088,646

(22) Filed: Nov. 4, 2020

(51) Int. Cl.
*H03B 5/12* (2006.01)
*H01L 49/02* (2006.01)
*H01L 27/06* (2006.01)

(52) U.S. Cl.
CPC ....... *H03B 5/1212* (2013.01); *H01L 27/0629* (2013.01); *H01L 28/10* (2013.01); *H01L 28/40* (2013.01); *H03B 5/1228* (2013.01)

(58) Field of Classification Search
CPC .................................................... H03B 5/1212
USPC ...................................................... 331/117 R
See application file for complete search history.

(56) References Cited

U.S. PATENT DOCUMENTS

| 2005/0046499 | A1* | 3/2005 | Luong | H03B 5/124 |
| | | | | 331/117 R |
| 2007/0052512 | A1* | 3/2007 | Jeon | H01F 21/12 |
| | | | | 336/200 |
| 2009/0184774 | A1* | 7/2009 | Deng | H03B 5/1253 |
| | | | | 331/117 FE |
| 2015/0145612 | A1* | 5/2015 | Lu | H03B 5/1228 |
| | | | | 331/117 R |
| 2015/0214891 | A1* | 7/2015 | Shi | H03B 5/1228 |
| | | | | 331/117 R |
| 2017/0141728 | A1* | 5/2017 | Chen | H03B 5/1228 |
| 2017/0179881 | A1* | 6/2017 | Caffee | H03B 5/08 |
| 2019/0043649 | A1* | 2/2019 | Saeki | H01F 17/0013 |
| 2020/0259455 | A1* | 8/2020 | Komijani | H03B 5/1212 |

* cited by examiner

*Primary Examiner* — Joseph Chang
(74) *Attorney, Agent, or Firm* — McClure, Qualey & Rodack, LLP

(57) ABSTRACT

An integrated oscillator includes a first inductor laid out as a first loop and a second inductor laid out as a second loop; a first capacitor laid out between two ends of the first loop; a second capacitor laid out between two ends of the second loop; a third inductor, a fourth inductor, a third capacitor, and a fourth capacitor that are laid out inside the first loop; and a cross-coupling transistor pair configured to electrically cross couple the two ends of the first loop and also the two ends of the second loop. The whole structure is substantially symmetrical with respect to a plane of symmetry.

20 Claims, 4 Drawing Sheets

INTEGRATED LC OSCILLATOR AND METHOD THEREOF

BACKGROUND OF THE DISCLOSURE

Field of the Disclosure

The present disclosure generally relates to LC oscillators and more particularly to LC oscillators having reduced phase noise.

Description of Related Art

As depicted in FIG. 1, a conventional LC (which stands for inductor-capacitor) oscillator 100 comprises a first LC tank 110, a cross-coupling pair 120, and a second LC tank 130. The first LC tank 110 comprises inductor 111 and capacitor 112 configured to resonate at a resonant frequency. The cross-coupling pair 120 comprises two NMOS (n-channel metal oxide semiconductor) transistors 121 and 122 configured in a cross-coupling topology. The second LC tank 130 comprises inductor 131 and capacitor 132 configured to resonate at twice of the resonant frequency of the first LC tank 110. A center tap of the first inductor 111 connects to a power supply node denoted by "$V_{DD}$." The first LC tank 110 determines an oscillation frequency that is approximately equal to the resonant frequency. The cross-coupling pair 120 provides a regeneration function to compensate an Ohmic loss of the first LC tank 110 and thus sustains the oscillation. The second LC tank 130 is configured to provide a source degeneration of the cross-coupling pair 120 to suppress a phase noise of the LC oscillator 100 that results from an up-conversion of a flicker noise of the cross-coupling pair 120. LC oscillator 100 is well known in the prior art and thus not further explained.

A scenario of interest is that the LC oscillator 100 is integrated on a silicon substrate using a CMOS (complementary metal oxide semiconductor) process. It is desired that the LC oscillator 100 is compact in layout and has a low phase noise. It is also desired that, a magnetic coupling between LC oscillator 100 and other circuits that co-exist on the same silicon substrate can be alleviated.

What is desired is an integrated LC oscillator that is compact in layout and has a low phase noise, while alleviating a magnetic coupling with other circuits that co-exist on the same silicon substrate.

BRIEF DESCRIPTION OF THIS DISCLOSURE

In an embodiment, an integrated oscillator comprises: a first inductor laid out as a first loop looping from a first end to a second end, the first loop being substantially symmetrical with respect to a plane of symmetry; a second inductor laid out as a second loop looping from a third end to a fourth end, the third end being joined with the first end, the fourth end being joined with the second end, the second loop being substantially symmetrical with respect to the plane of symmetry; a third inductor laid out as a counterclockwise spiral inside the first loop on one side of the plane of symmetry; a fourth inductor laid out as a clockwise spiral inside the first loop, the fourth inductor being a mirror image of the third inductor with respect to the plane of symmetry; a ground strip laid out along the plane of symmetry to provide a common termination of the third inductor and the fourth inductor; a first capacitor laid out between the first end and the second end; a second capacitor laid out between the third end and the fourth end; a third capacitor laid out between the third inductor and the ground strip; a fourth capacitor laid out between the fourth inductor and the ground strip, the fourth capacitor being a mirror image of the third capacitor with respect to the plane of symmetry; and a cross-coupling transistor pair configured to electrically cross couple the first end and the second end.

In an embodiment, a method of integrating an oscillator comprises: laying out a first inductor as a first loop looping from a first end to a second end in a substantially symmetrical manner with respect to a plane of symmetry; laying out a second inductor as a second loop looping from a third end to a fourth end in a substantially symmetrical manner with respect to the plane of symmetry, the third end being joined with the first end and the fourth end being joined with the second end; laying out a third inductor as a counterclockwise spiral inside the first loop on one side of the plane of symmetry; laying out a fourth inductor as a clockwise spiral inside the first loop, the fourth inductor being a mirror image of the third inductor with respect to the plane of symmetry; laying out a ground strip along the plane of symmetry to provide a common termination of the third inductor and the fourth inductor; laying out a first capacitor between the first end and the second end; laying out a second capacitor between the third end and the fourth end; laying out a third capacitor between the third inductor and the ground strip; laying out a fourth capacitor between the fourth inductor and the ground strip; and laying out a cross-coupling transistor pair to electrically cross couple the first end and the second end.

DETAILED DESCRIPTION OF THIS DISCLOSURE

Figure 1:
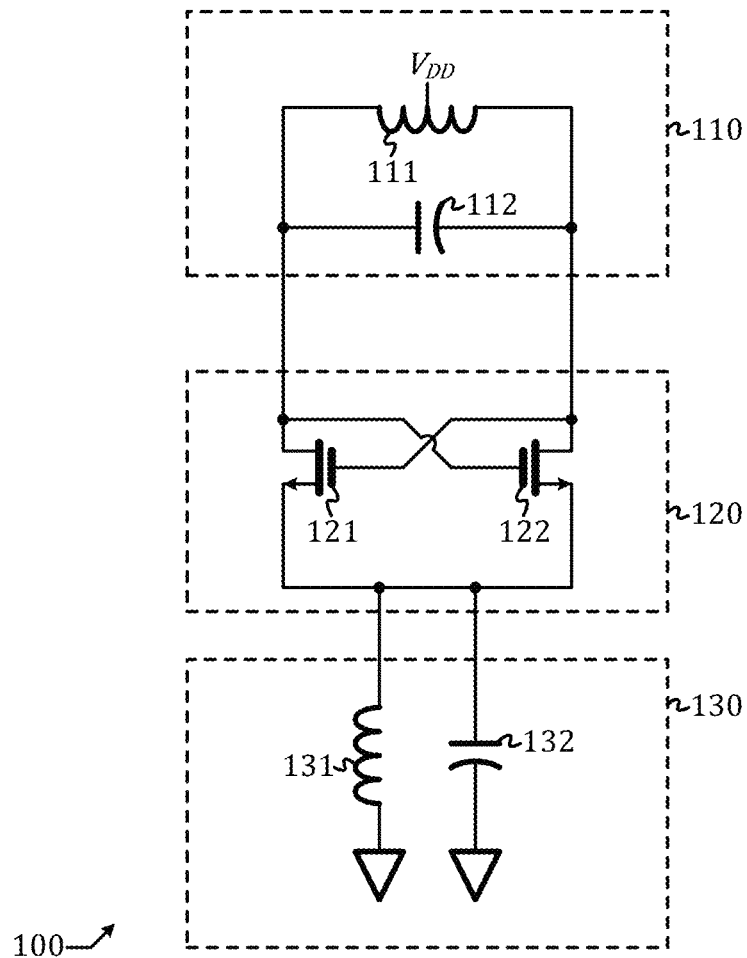
FIG. 1 shows a schematic diagram of a conventional LC oscillator.

The present disclosure is directed to LC oscillator and associated method. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "oscillator," "frequency," "resonance," "power supply," "ground," "CMOS (complementary metal oxide semiconductor)," "NMOS (n-channel metal oxide semiconductor)," "inductor," "capacitor," "via," "cross couple," and "coil." Terms like these are used in a context of microelectronics, and the associated concepts are apparent to those of ordinary skills in the art and thus will not be explained in detail here.

Those of ordinary skill in the art can recognize a capacitor symbol, an inductor symbol, a mutual inductive coupling
} symbol, and can recognize a NMOS (n-channel metal-oxide semiconductor) transistor symbol, and identify the "source," the "gate," and the "drain" terminals thereof. Those of ordinary skills in the art can read schematics of a circuit comprising components such as capacitors, inductors, NMOS transistors, and so on, and do not need a verbose description about how one component connects with another in the schematics.

This present disclosure is presented in terms from an engineering perspective. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

A power supply node is a circuit node of a voltage that is approximately equal to a power supply voltage that is higher than zero but might have a small high-frequency fluctuation. A ground node is a circuit node of a voltage that is approximately zero but might have a small high-frequency fluctuation.

Throughout this disclosure, "$V_{DD}$" denotes a first power supply node. In this disclosure, depending on a context that is apparent to those of ordinary skill in the art, sometimes $V_{DD}$ refers to the voltage level at the power supply node $V_{DD1}$. For instance, it is apparent that when it is said that "$V_{DD}$ is 0.7V", it means that the voltage level at the power supply node $V_{DD}$ is 0.7V.

A circuit is a collection of a transistor, a resistor, an inductor, a capacitor, and/or other electronic devices inter-connected in a certain manner to embody a certain designed function.

An inductor comprises an electrical conduction path, usually embodied by a metal wire (or trace) that is structured in a manner that allows a current to flow through and excite a magnetic field. An inductor is often embodied by a metal wire (or trace) configured in a loop topology with two open ends including a first end and a second end, wherein a current can flow from the first end to the second end. A coil is an inductor that comprises a metal wire (or trace) configured in a multi-turn spiral topology.

A CMOS process technology allows integrating a plurality of transistors, capacitors, and inductors that are laid out in a multi-layer structure and inter-connected using metal traces and inter-metal-layer vias. An objective of this present invention is to integrate a LC oscillator using a CMOS process technology within a compact layout area while achieving a low noise performance. A multi-layer structure of a CMOS technology comprises a poly-silicon layer and multiple metal layers including a UTM (ultra-thick metal) layer, a RDL (re-distribution layer), and a plurality of lower metal layers. By way of example but not limitation, a 28 nm 1P7M (comprising one poly-silicon layer, one UTM layer, six lower metal layers, and a RDL in the multi-layer structure) CMOS technology is used.

Figure 2A:
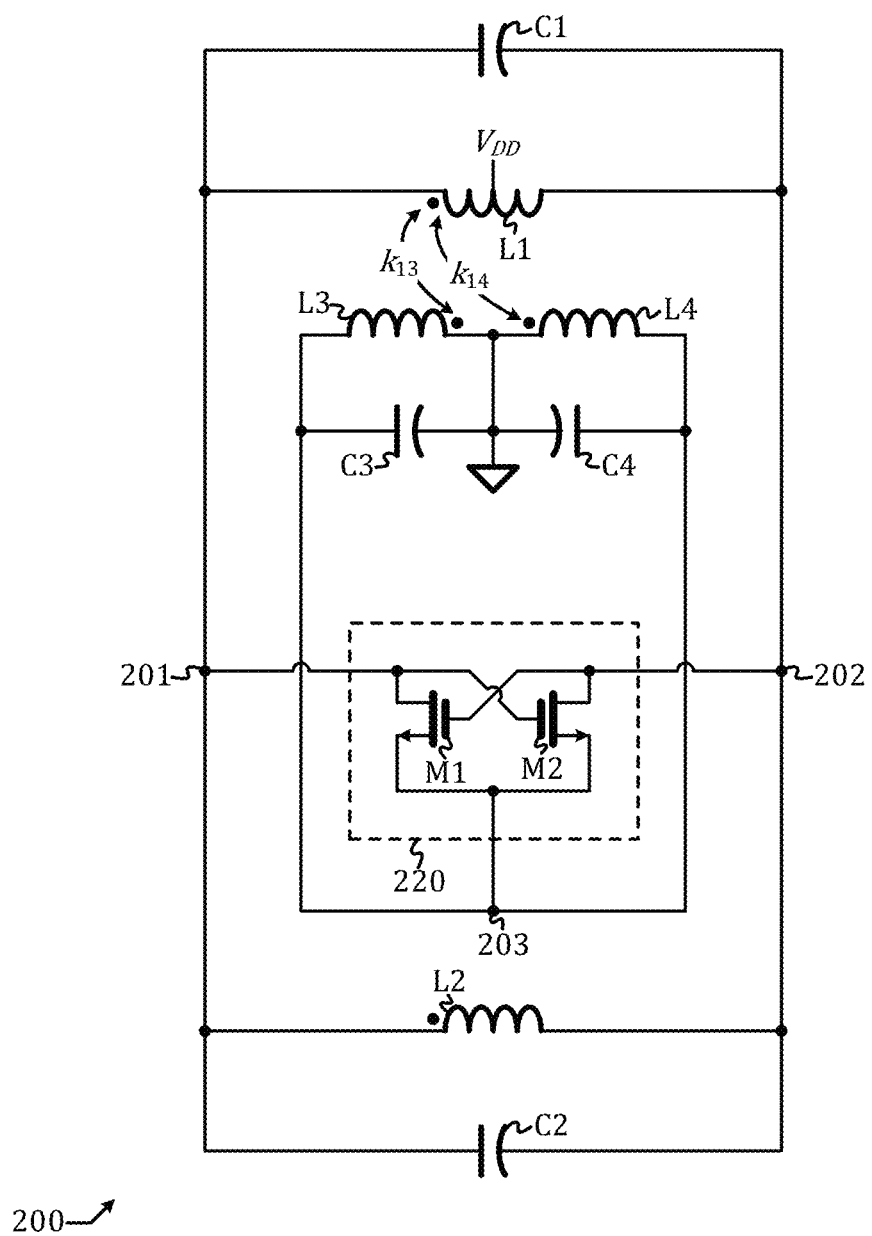
FIG. 2A shows a schematic diagram of an integrated LC oscillator in accordance with an embodiment of the present disclosure.

A schematic diagram of a LC oscillator 200 in accordance with an embodiment of the present invention is depicted in FIG. 2A. LC oscillator 200 is integrated and fabricated on a silicon substrate using a 28 nm 1P7M CMOS technology, which is by way of example but not limitation, as stated earlier. LC oscillator 200 comprises: a first inductor L1, a second inductor L2, a third inductor L3, a fourth inductor L4, a first capacitor C1, a second capacitor C2, a third capacitor C3, a fourth capacitor C4, and a cross-coupling pair 220 comprising a first NMOS transistor M1 and a second NMOS transistor M2. A center tap of the first inductor L1 connects to the power supply node "$V_{DD}$." By way of example but not limitation, $V_{DD}$ is 0.7V. There is a first mutual coupling, denoted by $k_{13}$, between the first inductor L1 and the third inductor L3, and a second mutual coupling, denoted by $k_{14}$, between the first inductor L1 and the fourth inductor L4. As far as a function is concerned, LC oscillator 200 is similar to LC oscillator 100 of FIG. 1. The first inductor L1 and the second inductor L2 are both placed across a first node 201 and a second node 202 and thus are connected in parallel, jointly embodying a single inductor like inductor 111 of FIG. 1. The first capacitor C1 and the second capacitor C2 are both placed across the first node 201 and the second node 202 and thus are connected in parallel, jointly embodying a function of a single capacitor like capacitor 112 of FIG. 1. The third inductor L3 and the fourth inductor L4 are both placed across a third node 203 and a ground node and thus are connected in parallel, jointly embodying a function of a single inductor like inductor 131 of FIG. 1. The third capacitor C3 and the fourth capacitor C4 are both placed across the third node 203 and the ground node, jointly embodying a function of a single capacitor like capacitor 132 of FIG. 1. The cross-coupling pair 220 embodies a function of the cross-coupling pair 120 of FIG. 1.

Briefly, inductor 111 is split into two parallel inductors L1 and L2, while inductor 131 is split into two parallel inductors L3 and L4. An advantage of the split will be explained later. Besides, a main difference between LC oscillator 200 and LC oscillator 100 of FIG. 1 is the first mutual coupling $k_{13}$ (between the first inductor L1 and the third inductor L3) and the second mutual coupling $k_{14}$ (between the first inductor L1 and the fourth inductor L4). In an embodiment, the first inductor L1 and the second inductor L2 are identical, the first capacitor C1 and the second capacitor C2 are identical, the third capacitor C3 and the fourth capacitor C4 are identical, and the third inductor L3 and the fourth inductor L4 are identical. The first mutual coupling $k_{13}$ and $k_{14}$ are identical in magnitude but opposite in sign.

Due to an objective of a compact layout, the first inductor L1, the third inductor L3, and the fourth inductor L4 are placed in closed proximity, and therefore both the first mutual coupling $k_{13}$ and the second mutual coupling $k_{14}$ are quite strong. However, due to that the first mutual coupling $k_{13}$ and the second mutual coupling $k_{14}$ are identical in magnitude but opposite in sign, an effect of the first mutual coupling $k_{13}$ cancels with an effect of the second mutual coupling $k_{14}$. This way, an effect of a strong mutual coupling due to a compact layout is alleviated.

Figure 2B:
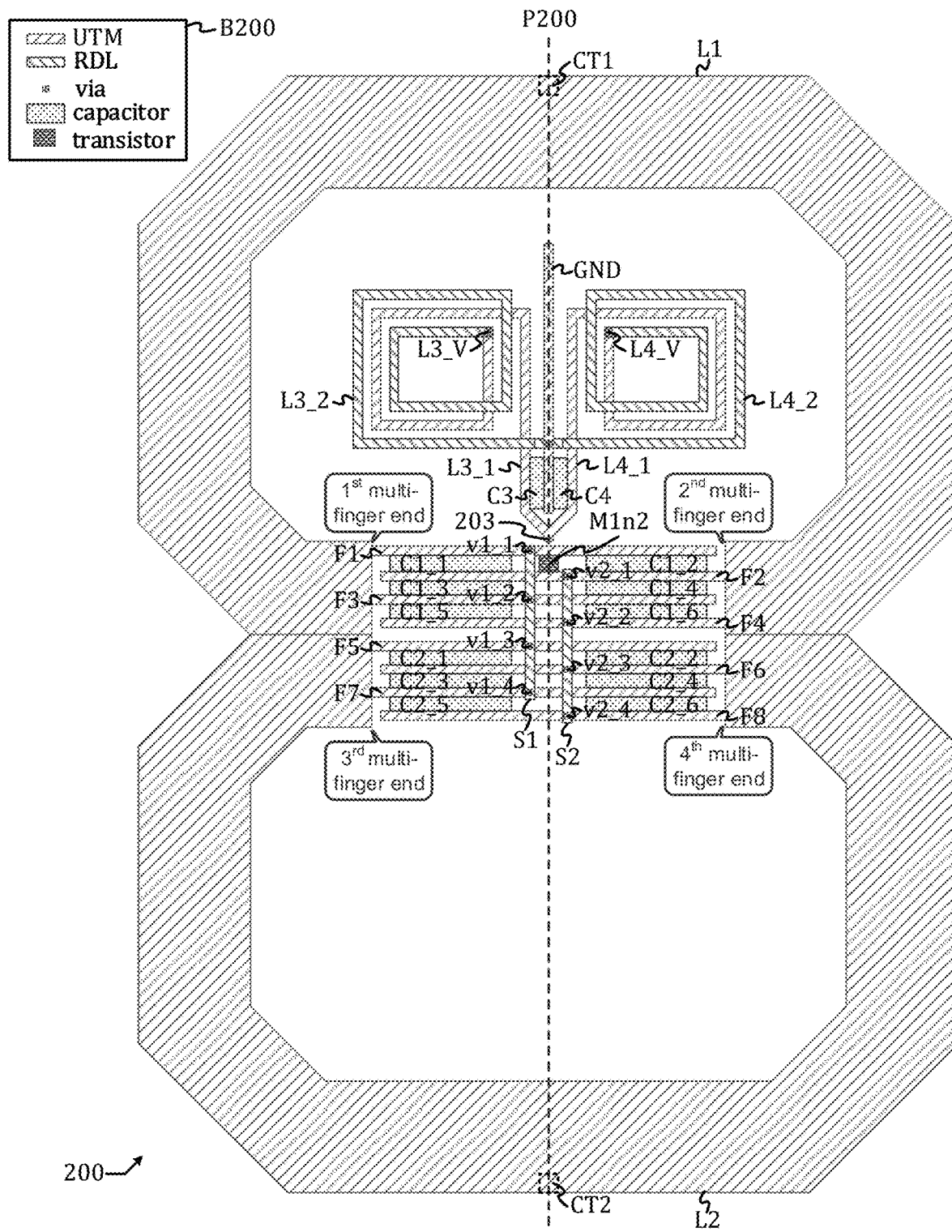
FIG. 2B shows a top view of a layout of the integrated LC oscillator of FIG. 2A.

A top view of a layout of LC oscillator 200 is shown in FIG. 2B. A legend is shown inside box B200. The first inductor L1 is laid out on the UTM layer in a loop topology with two interdigitated multi-finger ends including a first multi-finger end comprising fingers F1 and F3 and a second multi-finger end comprising fingers F2 and F4. The second inductor L2 is laid out on the UTM layer in a loop topology with two interdigitated multi-finger ends including a third multi-finger end comprising fingers F5 and F7 and a fourth multi-finger end comprising fingers F6 and F8. The first multi-finger end is electrically joined with the third multi-finger end, effectively embodying the first node 201. The second multi-finger end is electrically joined with the fourth multi-finger end, effectively embodying the second node 202. In a further embodiment, LC inductor further comprises: a first strip S1 laid out on the RDL and a first set of vias comprising v1_1, v1_2, v1_3, and v1_4 configured to connect fingers F1, F3, F5, and F7, so that they are electrically shorted and jointly embody the first node 201 in a distributed manner; and a second strip S2 laid out on the RDL and a second set of vias comprising v2_1, v2_2, v2_3, and v2_4 configured to connect fingers F2, F4, F6, and F8, so that they are electrically shorted and jointly embody the second node 202 in a distributed manner. The third inductor L3 and the fourth inductor L4 are laid out inside the loop of the first inductor L1. The third inductor L3 comprises a first coil L3_1 laid out on the UTM layer and a second coil L3_2 laid out on the RDL, wherein both the first coil L3_1 and the second coil L3_2 are laid out in a spiral topology spiraling in a counterclockwise direction and connected through a via L3_V. The fourth inductor L4 comprises a third coil L4_1 laid out on the UTM layer and a fourth coil L4_2 laid out on the RDL, wherein both the third coil L4_1 and the fourth coil L4_2 are laid out in a spiral topology spiraling in a clockwise direction and connected through a via L4_V.

The first NMOS transistor M1 and the second NMOS transistor M2 are laid out in the area labeled by M1n2. The first capacitor C1 is embodied in a distributed manner and comprises capacitors C1_1, C1_2, C1_3, C1_4, C1_5, and C1_6. The second C2 is also embodied in a distributed manner and comprises capacitors C2_1, C2_2, C2_3, C2_4, C2_5, and C2_6. Capacitors C1_1 and C1_2 are placed between fingers F1 and F2. Capacitors C1_3 and C1_4 are placed between fingers F2 and F3. Capacitors C1_5 and C1_6 are placed between fingers F3 and F4. Capacitors C2_1 and C2_2 are placed between fingers F5 and F6. Capacitors C2_3 and C2_4 are placed between fingers F6 and F7. Capacitors C2_5 and C2_6 are placed between fingers F7 and F8. A ground strip labeled by "GND" is laid out on the UTM layer to provide a common termination to the third inductor L3 and the fourth inductor L4 and embody a ground node. Note that the third inductor L3 and the fourth inductor L4 are also connected at the third node 203, as shown in both FIG. 2A and FIG. 2B.

The third inductor L3 and the fourth inductor L4 are mirror images of each other with respect a plane of symmetry P200. Note that the plane of symmetry P200 is an imaginary line from a top view perspective. The ground strip GND is laid out along the plane of symmetry P200. Both the first inductor L1 and the second inductor L2 are substantially symmetrical with respect to the plane of symmetry P200. Due to the symmetry, a current flowing from the third node 203 into the third inductor L3 and a current flowing from the third node 203 into the fourth inductor L4 will be the same but spiral in an opposite direction: the former in a counterclockwise direction, while the latter in a clockwise direction. Therefore, a mutual coupling between the third inductor L3 and the first inductor L1 (i.e. $k_{13}$) and a mutual coupling between the fourth inductor L4 and the first inductor L1 (i.e. $k_{14}$) will be the same in magnitude but opposite in sign. This way, a net effect of a strong magnetic coupling due to laying out the third inductor L3 and the fourth inductor L4 inside the first inductor L1 in a close proximity is zero.

In an embodiment, every capacitor in FIG. 2B (i.e. C1_1, C1_2, and so on) is a MOM (metal-oxide-metal) capacitor including a plurality of interdigitating fingers in lower metal layers along with a plurality of vias. MOM capacitors are well known in the prior art and thus not further described here.

An advantage of splitting inductor 111 into parallel inductors L1 and L2 is: a first current of L1 that flows from the first multi-finger end to the second multi-finger end in a clockwise direction will always be accompanied with a second current of L2 that flows from the third multi-finger end to the fourth multi-finger end in a counterclockwise direction, so that a magnetic field excited by the first current and a magnitude field excited by the second current can form a closed loop and thus a magnitude flux can be confined. An undesired magnetic coupling between LC oscillator 200 and whatever circuits co-existing on the same silicon substrate can be effectively alleviated.

An advantage of splitting inductor 131 into parallel inductors L3 and L4 is: L3 and L4 can be placed inside the loop of L1 and thus it allows a compact layout while avoiding an undesired net coupling with L1 thanks to a symmetry in layout that makes the magnetic coupling between L1 and L3 cancels the magnetic coupling between L1 and L4.

LC oscillator 200 can have a low phase noise thanks to a source degeneration provided by inductors L3 and L4 along with capacitors C3 and C4 in the same manner as the source degeneration provided by inductor 131 and capacitor 132 in the LC oscillator 100.

As illustrated in FIG. 2B, a first center tap location CT1 is marked at a mid-point of the first inductor L1 on the plane of symmetry P200, while and a second center tap location CT2 is marked at a mid-point of the second inductor L2 on the plane of symmetry P200. As shown in FIG. 2A, the power supply node "$V_{DD}$" connects to the center tap of the first inductor L1, i.e. CT1 in FIG. 2B. In an alternative embodiment not shown in FIG. 2A, the power supply node "$V_{DD}$" connects to the center tap of the second inductor L2 (i.e. CT2 in FIG. 2B), instead of to the center tap of the first inductor L1. In a yet another embodiment, the power supply node "$V_{DD}$" connects to both the center tap of the first inductor L1 and the center tap of the second inductor L2.

The first inductor L1 has two multi-fingers ends (i.e. the first multi-finger end and the second multi-finger end) that are interdigitated; this allows the first capacitor C1 to be laid out between the two multi-finger ends in a distributed manner, resulting in a compact layout area, as part of the layout area of the first inductor is re-used for laying out the first capacitor. The same thing can be said about the second inductor L2 and the second capacitor C2. Multi-finger topology, however, is advantageous but not mandatory.

Figure 3:
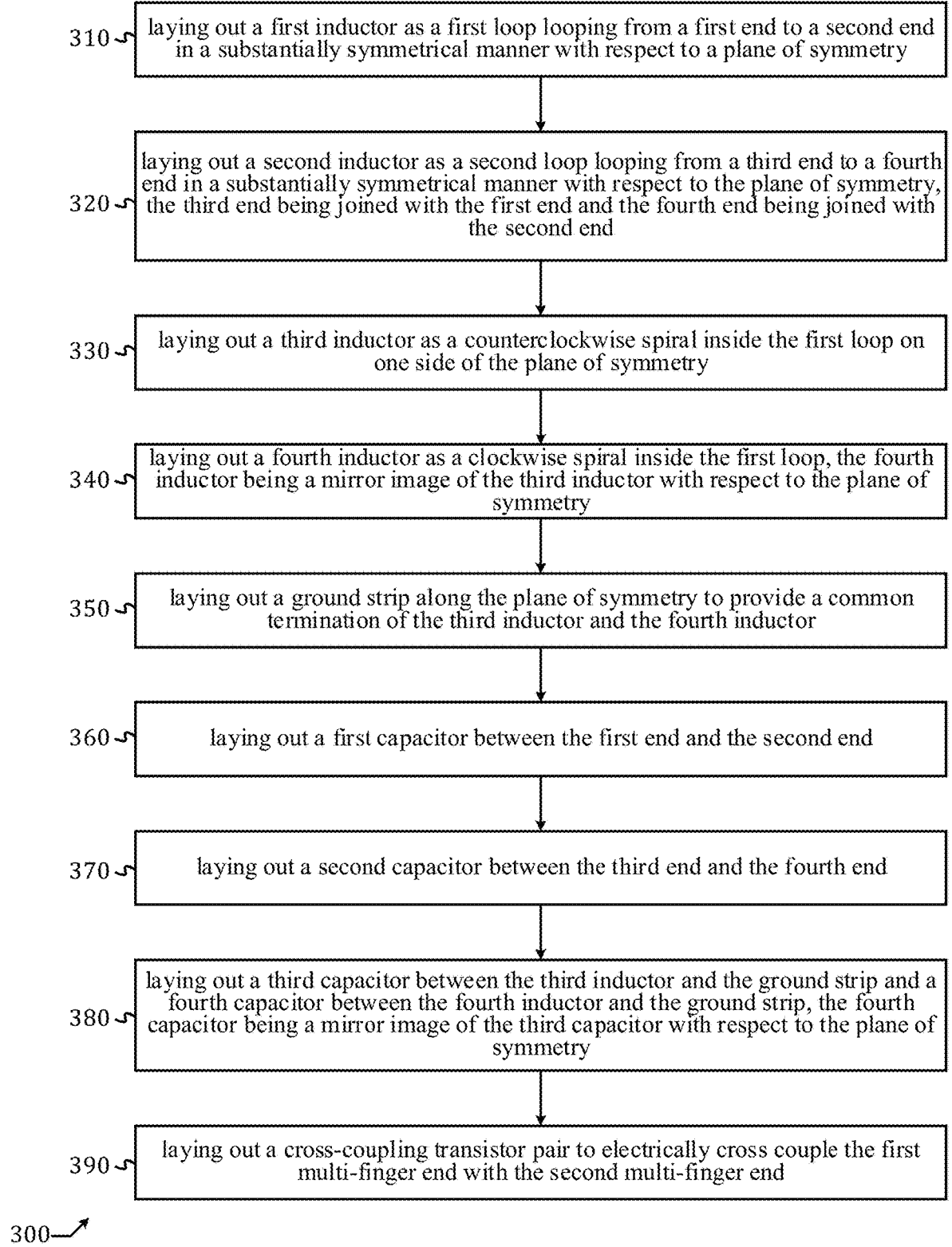
FIG. 3 shows a flow diagram of a method in accordance with the present disclosure.

As illustrated by a flow diagram 300 shown in FIG. 3, a method of integrating an oscillator in accordance with an embodiment of the present disclosure comprises: (step 310) laying out a first inductor as a first loop looping from a first end to a second end in a substantially symmetrical manner with respect to a plane of symmetry; (step 320) laying out a second inductor as a second loop looping from a third end to a fourth end in a substantially symmetrical manner with respect to the plane of symmetry, the third end being joined with the first end and the fourth end being joined with the second end; (step 330) laying out a third inductor as a counterclockwise spiral inside the first loop on one side of the plane of symmetry; (step 340) laying out a fourth inductor as a clockwise spiral inside the first loop, the fourth inductor being a mirror image of the third inductor with respect to the plane of symmetry; (step 350) laying out a ground strip along the plane of symmetry to provide a common termination of the third inductor and the fourth inductor; (step 360) laying out a first capacitor between the first end and the second end; (step 370) laying out a second capacitor between the third end and the fourth end; (step 380) laying out a third capacitor between the third inductor and the ground strip and a fourth capacitor between the fourth inductor and the ground strip, the fourth capacitor being a mirror image of the third capacitor with respect to the plane of symmetry; and (step 390) laying out a cross-coupling transistor pair to electrically cross couple the first end and the second end.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An integrated oscillator comprising:
a first inductor laid out as a first loop looping from a first end to a second end, the first loop being substantially symmetrical with respect to a plane of symmetry;
a second inductor laid out as a second loop looping from a third end to a fourth end, the third end being joined with the first end, the fourth end being joined with the second end, the second loop being substantially symmetrical with respect to the plane of symmetry;
a third inductor laid out as a counterclockwise spiral inside the first loop on one side of the plane of symmetry;
a fourth inductor laid out as a clockwise spiral inside the first loop, the fourth inductor being a mirror image of the third inductor with respect to the plane of symmetry;
a ground strip laid out along the plane of symmetry to provide a common termination of the third inductor and the fourth inductor;
a first capacitor laid out between the first end and the second end;
a second capacitor laid out between the third end and the fourth end;
a third capacitor laid out between the third inductor and the ground strip;
a fourth capacitor laid out between the fourth inductor and the ground strip, the fourth capacitor being a mirror image of the third capacitor with respect to the plane of symmetry; and
a cross-coupling transistor pair configured to electrically cross couple the first end and the second end.

2. The integrated oscillator of claim 1, wherein the first end is of a multi-finger topology comprising a first set of fingers, the second end is of a multi-finger topology comprising a second set of fingers that are inter-digitating with the first set of fingers, the third end is of a multi-finger topology comprising a third set of fingers, and the fourth end is of a multi-finger topology comprising a fourth set of fingers that are inter-digitating with the third set of fingers, wherein the first set of fingers, the second set of fingers, the third set of fingers, and the fourth set of fingers are all perpendicular to the plane of symmetry.

3. The integrated oscillator of claim 2, wherein the first capacitor is laid out in distributed manner between the first set of fingers and the second set of fingers, while the second capacitor is laid out in a distributed manner between the third set of fingers and the fourth set of fingers.

4. The integrated of claim 2 further comprising: a first connection strip and a first set of vias configured to electrically short the first set of fingers with the third set of fingers; and a second connection strip and a second set of vias configured to electrically short the second set of fingers with the fourth set of fingers.

5. The integrated oscillator of claim 1 being integrated on a silicon substrate using a CMOS (complementary metal oxide semiconductor) process comprising a multi-layer planer structure including an ultra-thick metal (UTM) layer, a re-distribution layer (RDL), a plurality of lower metal layers, and a plurality of via layers configured to provide inter-metal-layer electrical connection.

6. The integrated oscillator of claim 5, wherein the first inductor is laid out on the UTM layer.

7. The integrated oscillator of claim 5, wherein the second inductor is laid out on the UTM layer.

8. The integrated oscillator of claim 5, wherein the third inductor comprises a first coil laid out on the UTM layer, a second coil laid out on the RDL, and a via between the UTM layer and the RDL configured to electrically connect the first coil with the second coil.

9. The integrated oscillator of claim 1, wherein a center tap of the first inductor is located at the plane of symmetry and electrically connected to a power supply node.

10. The integrated oscillator of claim 1, wherein a center tap of the second inductor is located at the plane of symmetry and electrically connected to a power supply node.

11. A method of integrating an oscillator comprising:
laying out a first inductor as a first loop looping from a first end to a second end in a substantially symmetrical manner with respect to a plane of symmetry;
laying out a second inductor as a second loop looping from a third end to a fourth end in a substantially symmetrical manner with respect to the plane of symmetry, the third end being joined with the first end and the fourth end being joined with the second end;
laying out a third inductor as a counterclockwise spiral inside the first loop on one side of the plane of symmetry;
laying out a fourth inductor as a clockwise spiral inside the first loop, the fourth inductor being a mirror image of the third inductor with respect to the plane of symmetry;
laying out a ground strip along the plane of symmetry to provide a common termination of the third inductor and the fourth inductor;
laying out a first capacitor between the first end and the second end;
laying out a second capacitor between the third end and the fourth end;
laying out a third capacitor between the third inductor and the ground strip;
laying out a fourth capacitor between the fourth inductor and the ground strip; and
laying out a cross-coupling transistor pair to electrically cross couple the first end and the second end.

12. The method of integrating an oscillator of claim 11, wherein the first end is of a multi-finger topology comprising a first set of fingers, the second end is of a multi-finger topology comprising a second set of fingers that are inter-digitating with the first set of fingers, the third end is of a multi-finger topology comprising a third set of fingers, and the fourth end is of a multi-finger topology comprising a fourth set of fingers that are inter-digitating with the third set of fingers, wherein the first set of fingers, the second set of fingers, the third set of fingers, and the fourth set of fingers are all perpendicular to the plane of symmetry.

13. The method of integrating an oscillator of claim 12, wherein the first capacitor is laid out in distributed manner between the first set of fingers and the second set of fingers, while the second capacitor is laid out in a distributed manner between the third set of fingers and the fourth set of fingers.

14. The method of integrating an oscillator of claim 12 further comprising: laying out a first connection strip and a first set of vias configured to electrically short the first set of fingers with the third set of fingers; and laying out a second connection strip and a second set of vias configured to electrically short the second set of fingers with the fourth set of fingers.

15. The method of integrating an oscillator of claim 11, wherein the oscillator is integrated on a silicon substrate using a CMOS (complementary metal oxide semiconductor) process comprising a multi-layer planer structure including an ultra-thick metal (UTM) layer, a re-distribution layer (RDL), a plurality of lower metal layers, and a plurality of via layers configured to provide inter-metal-layer electrical connection.

16. The method of integrating an oscillator of claim 15, wherein the first inductor is laid out on the UTM layer.

17. The method of integrating an oscillator of claim 15, wherein the second inductor is laid out on the UTM layer.

18. The method of integrating an oscillator of claim 15, wherein the third inductor comprises a first coil laid out on the UTM layer, a second coil laid out on the RDL, and a via between the UTM layer and the RDL configured to electrically connect the first coil with the second coil.

19. The method of integrating an oscillator of claim 11, wherein a center tap of the first inductor is located at the plane of symmetry and electrically connected to a power supply node.

20. The method of integrating an oscillator of claim 11, wherein a center tap of the second inductor is located at the plane of symmetry and electrically connected to a power supply node.

* * * * *